United States Patent
Briere

(10) Patent No.: US 8,791,503 B2
(45) Date of Patent: Jul. 29, 2014

(54) III-NITRIDE SEMICONDUCTOR DEVICE WITH REDUCED ELECTRIC FIELD BETWEEN GATE AND DRAIN AND PROCESS FOR ITS MANUFACTURE

(75) Inventor: Michael A. Briere, Woonsocket, RI (US)

(73) Assignee: International Rectifier Corporation, El Segundo, CA (US)

( * ) Notice: Subject to any disclaimer, the term of this patent is extended or adjusted under 35 U.S.C. 154(b) by 1126 days.

(21) Appl. No.: 12/211,120

(22) Filed: Sep. 16, 2008

(65) Prior Publication Data

US 2009/0072273 A1 Mar. 19, 2009

Related U.S. Application Data

(60) Provisional application No. 60/973,295, filed on Sep. 18, 2007, provisional application No. 60/973,367, filed on Sep. 18, 2007.

(51) Int. Cl.
*H01L 29/66* (2006.01)
(52) U.S. Cl.
USPC .......................................... 257/194; 438/285
(58) Field of Classification Search
USPC .......................................... 257/194; 438/285
See application file for complete search history.

(56) References Cited

U.S. PATENT DOCUMENTS

| | | | |
|---|---|---|---|
| 6,265,726 B1 | 7/2001 | Manabe et al. | 257/13 |
| 7,217,960 B2 | 5/2007 | Ueno et al. | 257/103 |
| 7,250,641 B2 | 7/2007 | Saito et al. | 257/192 |
| 2006/0145189 A1* | 7/2006 | Beach | 257/192 |
| 2008/0272397 A1* | 11/2008 | Koudymov et al. | 257/192 |
| 2010/0244045 A1* | 9/2010 | Yanagihara et al. | 257/76 |

FOREIGN PATENT DOCUMENTS

| | | |
|---|---|---|
| JP | 2000-277724 | 10/2000 |
| JP | 2006-310769 | 11/2006 |
| WO | WO 2009/038717 | 3/2009 |

OTHER PUBLICATIONS

International Search Report dated Dec. 3, 2008.

\* cited by examiner

*Primary Examiner* — Tony Tran
(74) *Attorney, Agent, or Firm* — Farjami & Farjami LLP

(57) ABSTRACT

A conductive field plate is formed between the drain electrode and gate of each cell of a III-Nitride semiconductor and is connected to the source electrode to reduce the electric field between the gate and the drain. The electrodes may be supported on $N^+$ III-Nitride pad layers and the gate may be a Schottky gate or an insulated gate.

15 Claims, 4 Drawing Sheets

III-NITRIDE SEMICONDUCTOR DEVICE WITH REDUCED ELECTRIC FIELD BETWEEN GATE AND DRAIN AND PROCESS FOR ITS MANUFACTURE

RELATED APPLICATIONS

This application claims the benefit of U.S. Provisional Application No. 60/973,295, filed Sep. 18, 2007; and U.S. Provisional Application No. 60/973,367, filed Sep. 18, 2007, the entire disclosure of which is incorporated by reference herein.

FIELD OF THE INVENTION

The present application relates to semiconductor devices and methods of fabrication of semiconductor devices.

DEFINITION

As referred to herein III-Nitride refers to a semiconductor alloy from the InAlGaN system, including, but not limited to, GaN, AlGaN, AlN, InGaN, InAlGaN and the like.

BACKGROUND OF THE INVENTION

It is known that the electric field between the gate electrode and the drain electrode of a III-Nitride power semiconductor device affects the breakdown voltage thereof. Thus, it is desirable to reduce the gate to drain voltage that a gate electrode "sees" during the operation of the device.

SUMMARY OF THE INVENTION

To reduce the electric field between the gate electrode and the drain electrode, a device according to the present invention includes field plates each disposed between one or more pairs a gate electrode and a drain electrode, each field plate electrically shorted to the source electrode of the device.

More specifically, according to one aspect of the present invention, a III-Nitride power device is provided with a field plate over its heterojunction structure. The field plate may be comprised of a highly conductive III-Nitride body which is shorted to the source electrode of the device. As a result, the gate to drain voltage "seen" by the gate electrode is reduced, whereby the capability of the device to withstand breakdown is enhanced.

In a preferred method of fabrication of a device according to the present invention, to obtain as close a spacing between each gate electrode and a respective field plate, a wide conductive plate is fabricated using any desired method, and then the wide plate is separated into thinner respective interleaved gate electrodes and field plates, for example, through an appropriate etching step, to obtain separated gate electrodes and field plates.

Other features and advantages of the present invention will become apparent from the following description of the invention which refers to the accompanying drawings.

DETAILED DESCRIPTION OF THE DRAWINGS

Figure 1:
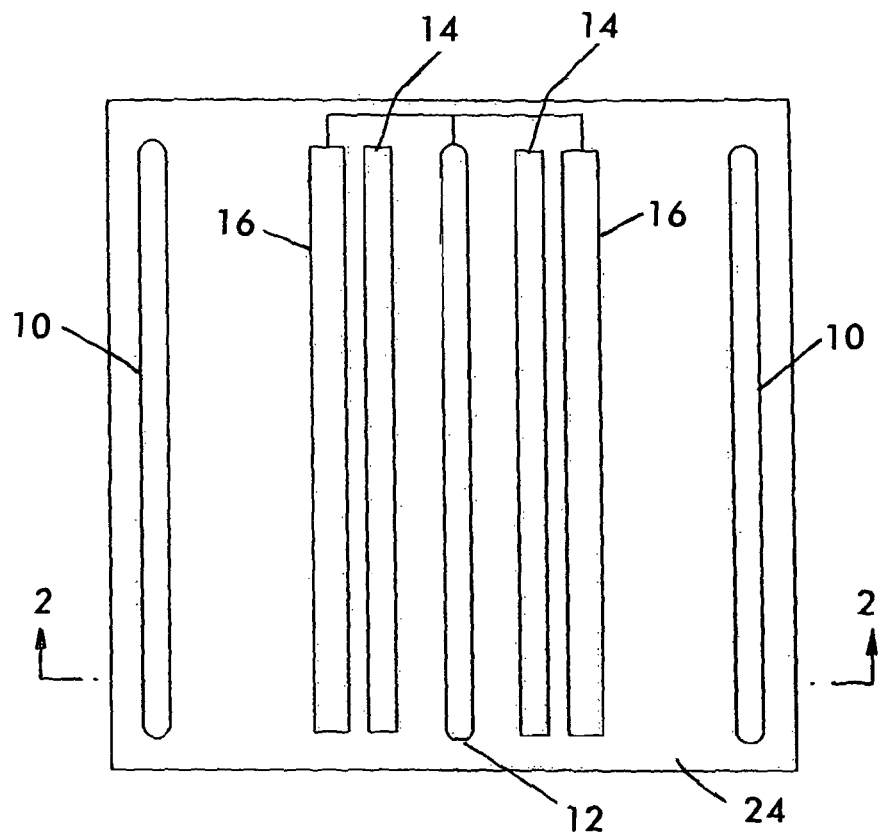
FIG. 1 schematically illustrates a top plan view of two adjacently disposed active cells in a device according to the present invention.

Referring to FIG. 1, two adjacent cells of a much larger device according to one embodiment of the present invention is shown. The device includes drain electrodes 10, a source electrode 12, gate electrodes 14 each disposed between source electrode 12 and a respective drain electrode 10, and field plates 16 each disposed between a gate electrode 14 and a respective drain electrode 10. All of electrodes 10, 12, 14 and field plate 16 may be of any desired conductive material deposited atop heterojunction 18.

According to one aspect of the present invention source electrode 12 and field plates 16 are electrically shorted to one another as schematically illustrated by FIG. 1.

Figure 2:
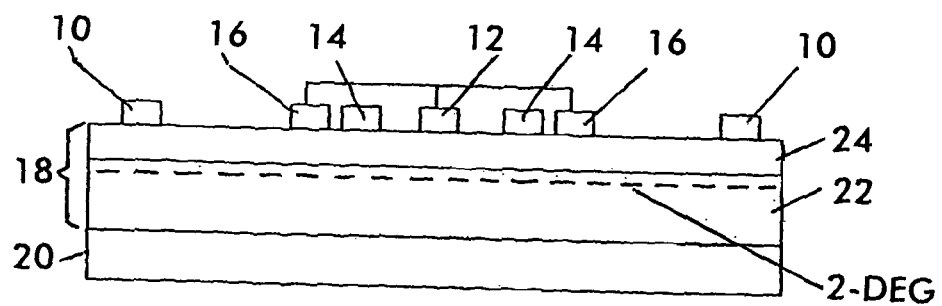
FIG. 2 schematically illustrates a cross-sectional view along line 2-2 viewed in the direction of the arrows.
Figure 3:
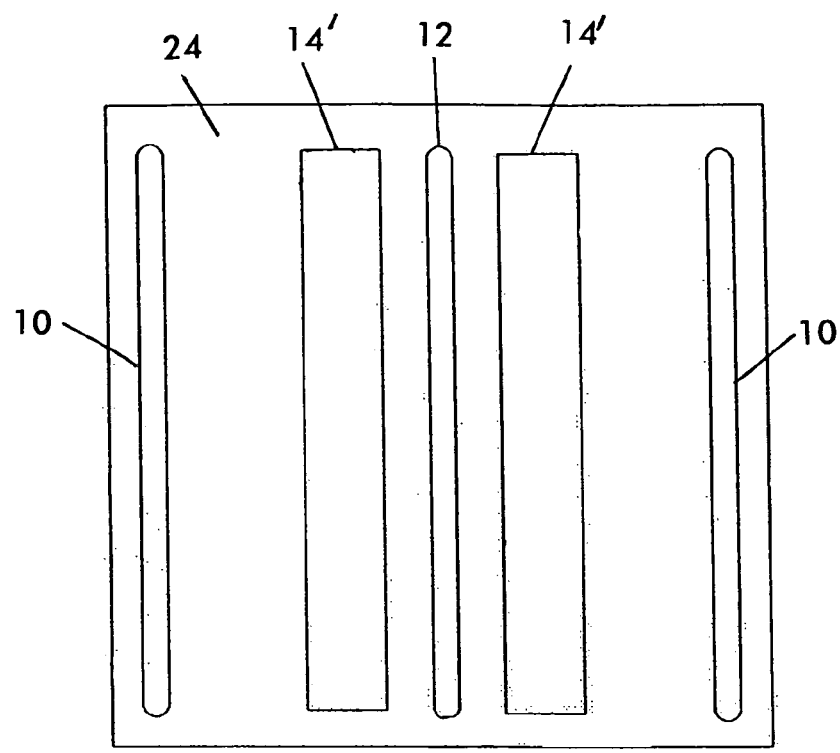
FIG. 3 schematically illustrates a top plan view of a device before the modification thereof using a process according to the present invention.

Referring now to FIG. 2, a device according to the present invention is preferably a III-Nitride power field effect device, such as a high electron mobility transistor (HEMT). A device according to the present invention thus includes the III-Nitride heterojunction 18 formed over a support body 20. III-Nitride heterojunction 18 includes a first III-Nitride body 22 serving preferably as a channel layer, and a second III-Nitride body 24 serving as a barrier layer. The thickness and composition of first and second III-Nitride bodies 22, 24 are selected to result in a conductive region at (or near) the heterojunction thereof, commonly referred to as a two-dimensional electron gas (2-DEG). In the embodiment of FIGS. 1, 2 and 3, first III-Nitride body 22 is comprised of GaN while second III-Nitride body 24 is comprised of AlGaN. Further, in the embodiment of FIGS. 1, 2 and 3, drain electrodes 10 and source electrode 12 make ohmic contact with second III-Nitride body 24, while gate electrodes 14 and field plates 16 make a Schottky contact to second III-Nitride body 24. Note that support body 20 may include a substrate which is compatible with first III-Nitride body 22 (e.g. a GaN substrate) or may include a substrate comprised of silicon, SiC, Sapphire, or the like having a transition body or layer (e.g. an AlN body) to allow for the growth thereon of first III-Nitride body 22.

Referring now to FIG. 3, in a preferred method for fabricating a device according to the present invention, a III-Nitride device is fabricated according to any suitable method to have wide gate electrodes 14 is formed between each drain electrode 10 and source electrode 12. Thereafter, each wide gate electrode 14 is split or separated into two strips (using any desired and suitable etching technique, for example) to obtain field plates 16 and gate electrodes 14 as illustrated by FIG. 1.

Figure 4:
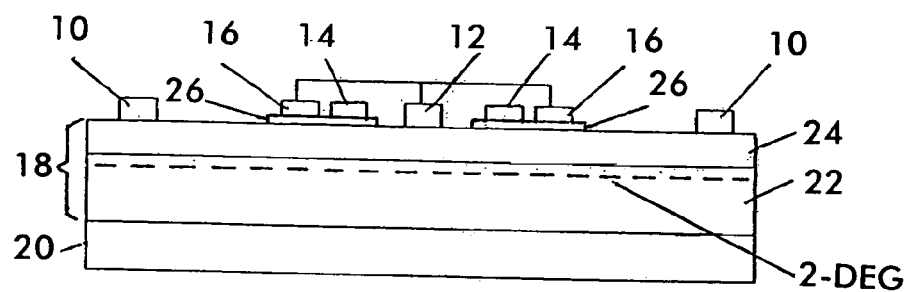
FIG. 4 schematically illustrates a cross-sectional view of a second embodiment of the present invention.

Referring now to FIG. 4, in which like numerals identify like features, in an alternative embodiment, gate electrodes 14 and field plates 16 are deposited over a gate insulation body 26 which is on body 24 and has a composition and thickness suitable to function as a gate dielectric. Thus, after splitting, layer 14' in FIG. 3, gate electrode 14 and field plate 16 may be capacitively coupled to body 24, rather than being Schottky coupled to body 24.

Figure 5:
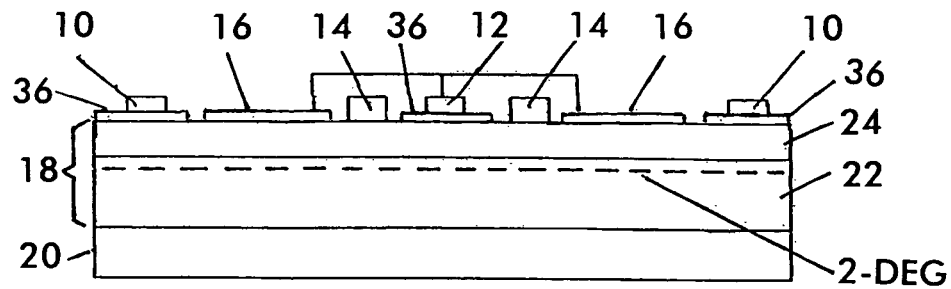
FIG. 5 schematically illustrates a cross-sectional view of two adjacent active cells of device according to a further embodiment of the present invention.

Referring next to FIG. 5, in which components similar to those of FIGS. 1 to 4 are given the same identifying numeral, a device according to the another embodiment of the present invention includes the III-Nitride heterojunction 18 formed over a support body 20. Heterojunction 18 includes the first III-Nitride body 22 formed over support body 20, and second III-Nitride body 24 formed over first III-Nitride body 22. The thickness and composition of first and second III-Nitride bodies 22, 24 are selected to form a two-dimensional electron gas at (or near) the heterojunction thereof, as is well known in the art.

In FIG. 5, first III-Nitride body 22 serves as the channel layer and may be composed of GaN, and second III-Nitride body 24 serves as the barrier layer and may be composed of AlGaN. Support body 20 may be a substrate that is compatible with first III-Nitride body 22, e.g. GaN, or may be a substrate (e.g. silicon, SiC or sapphire) that includes a transition layer (e.g. AlN) to allow for the growth thereon of first III-Nitride body 22.

The embodiment of FIG. 5 further includes, in each active cell thereof, first power electrode 12 (e.g. source electrode), second power electrode 10 (e.g. drain electrode), and a gate electrode 14 disposed between first power electrode 12 and second power electrode 10. In the preferred embodiment, gate electrode 14 makes a Schottky contact with second III-Nitride body. However, it should be understood that a gate electrode 14 may be capacitively coupled to second III-Nitride body 24 (e.g. through a gate dielectric) without deviating from the scope and the spirit of the present invention.

According to one aspect of the invention as shown in FIG. 5, field plate 16 that is comprised of highly conductive (e.g. N+) III-Nitride material (e.g. GaN or AlGaN) is disposed over second III-Nitride body 24 and between a gate electrode 14 and drain electrode 10. Field plates 16 are preferably electrically shorted to source electrode 12, whereby the voltage between gate electrode 14 and drain electrode 10 is reduced to improve the breakdown voltage of the device. The short can be formed in any desired manner.

In the embodiment of FIG. 5, each drain electrode 10 and source electrode 12 resides atop and is ohmically coupled to a respective highly conductive (e.g. N+) III-Nitride (e.g. GaN or AlGaN) pedestal 36 which is formed over second III-Nitride body 24, whereby ohmic connection between the power electrodes 10, 12 and second III-Nitride body 24 is improved.

Figure 6:
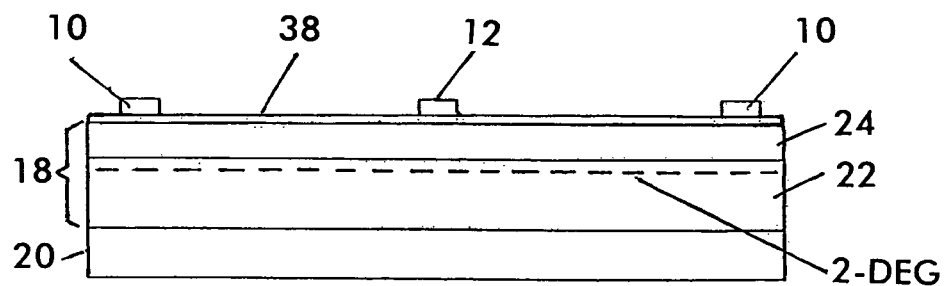
FIGS. 6 and 7 schematically illustrate selected steps in a process for the fabrication of the device of FIG. 5 according to the present invention.
Figure 7:
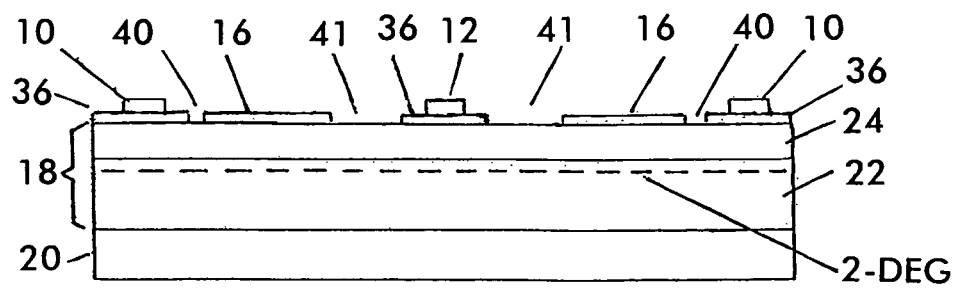

Referring now to FIGS. 6 and 7, to fabricate a device according to the embodiment of FIG. 5, the III-Nitride heterojunction 18 is formed over a support body 20 according to any suitable method. Thereafter, a highly conductive III-Nitride layer 38 (e.g. a layer of N+ GaN or N+ AlGaN) is grown over second III-Nitride body 24. Next, a layer of conductive material for forming power electrodes 10, 12 is formed on second III-Nitride body 24 and patterned to obtain electrodes 10 and 12.

Layer 38 is then patterned to include a plurality of gaps 40, 41 (FIG. 7) in order to obtain or define field plates 16 and pedestals 36. Note that gaps 40 and 41 serve to physically isolated field plates 16 and pedestals 36. Thereafter, gate electrodes 14 are formed in gaps 41 of FIG. 7 on second III-Nitride body 24, and field plates 16 and source electrode 12 are electrically shorted to obtain a device according to the present invention.

Figure 8:
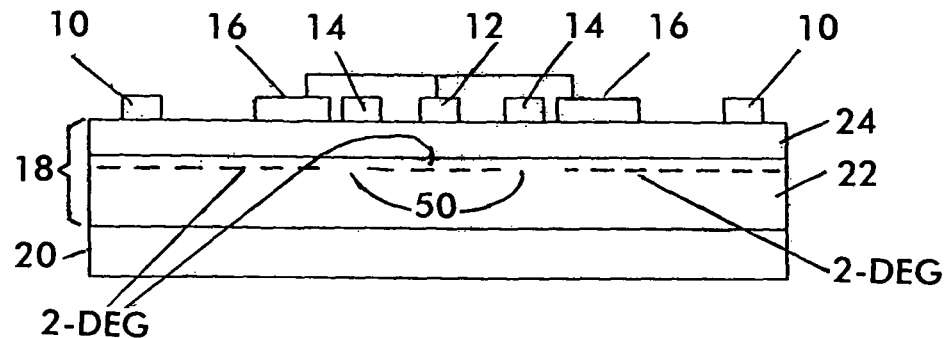
FIG. 8 schematically illustrates a cross-sectional view of two adjacent cells of a device in accordance with the invention according to a further embodiment of the invention.

Referring next to FIG. 8 in which numerals identify like features of the preceding Figures, the device is an enhancement mode device and field plates 16 may be any conductive material including metallic materials as well as a highly conductive III-Nitride laser or body as described above. An enhancement mode device according to this embodiment, includes a 2-DEG layer having an interrupted region or a region of reduced carrier density 50 under gate electrode 14. To obtain the interrupted region or the region of reduced carrier density many different methods may be used. For example, a recess may be formed in the body 24, an implanted region may be formed in either body 24 or 22, the surface of body 24 may be treated using CF4 under the gate, or local decomposition as set forth in U.S. application Ser. No. 11/906,842 filed Oct. 4, 2007, entitled III-Nitride Heterjunction Semiconductor Device and Method of Fabrication (IR-3282) (incorporated by reference) may be employed to obtain an interrupted 2-DEG or a 2-DEG of reduced density under gate electrode 14. U.S. application Ser. No. 11/040,657 filed Jan. 21, 2005, entitled Enhancement Mode III-Nitride FET (IR-2663) (incorporated herein in its entirety by reference) sets forth various way to obtain a 2-DEG layer having an interrupted region or a region of reduced carrier density under the gate electrode thereof Note that in the embodiment of FIG. 8 gate electrode 14 is Schottky coupled to body 16.

It has been found that the combination of a field plate 16 that is shorted to the source electrode in an enhancement mode device (i.e. a device with an interrupted 2-DEG or a 2-DEG with a reduced carrier density under the gate) results in a III-Nitride enhancement mode device that is stable during operation which up to now has eluded those skilled in the art.

Figure 9:
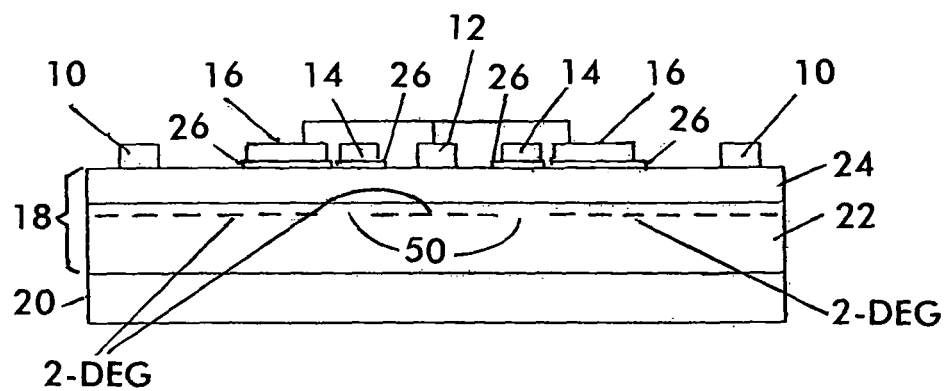
FIG. 9 is like FIG. 8 and shows a still further embodiment of the invention.

Referring next to FIG. 9, in which like numerals identify like features of the prior Figures, in a device according to the third embodiment of the present invention, and, as in FIG. 4, a gate dielectric 26 may be disposed between the gate electrodes 14 and body 24. Furthermore, dielectric body 26 may be disposed between field plates 16 and body 24. Note that in the embodiments of FIGS. 8 and 9, pedestals 26 may be omitted without deviating from the scope and the spirit of the present invention. Thus, electrodes 14 and 16 may be coupled ohmically to body 16.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A III-Nitride semiconductor device comprising:
a first III-Nitride layer of a first composition,
a second III-Nitride layer of a second composition different from the said first composition atop said first III-Nitride layer,
a 2DEG layer formed by the interface between said first and second III-Nitride layers,
a source contact connected to the free surface of said first III-Nitride layer,
a drain contact laterally spaced from said source contact and connected to said free surface of said first III-Nitride layer,
a gate contact coupled to said free surface of said first III-Nitride layer and disposed laterally between said source and drain contacts, and
a conductive field plate disposed between said gate and drain contacts and connected to said source contact to reduce the electric field between said gate and drain contacts when said 2DEG layer is non-conductive, said conductive field plate substantially coplanar with said gate contact, wherein said conductive field plate is formed from a first portion of a wide gate electrode, and wherein said gate contact is formed from a second portion of said wide gate electrode, said second portion being physically separated and laterally spaced from said first portion;

wherein said first layer is GaN and said second layer is AlGaN; and wherein said field plate is a layer of N type III-Nitride material.

2. The device of claim 1, wherein said second layer is supported on a substrate.

3. The device of claim 2, wherein said substrate is silicon and includes a transition layer connected to said second layer.

4. The device of claim 2, which further includes a highly conductive III-Nitride pad disposed between said source and drain contacts and said free surface of said first III-Nitride layer.

5. The device of claim 2, wherein said field plate is a layer of highly conductive N+ III-Nitride material.

6. The device of claim 1, wherein said gate contact is a Schottky contact.

7. The device of claim 6, which further includes a highly conductive III-Nitride pad disposed between said source and drain contacts and said free surface of said first III-Nitride layer.

8. The device of claim 6, wherein said field plate is a layer of highly conductive N+ III-Nitride material.

9. The device of claim 1, wherein said gate contact is dielectrically insulated from said surface of said first III-Nitride layer.

10. The device of claim 9, which further includes a highly conductive III-Nitride pad disposed between said source and drain contacts and said free surface of said first III-Nitride layer.

11. The device of claim 9, wherein said field plate is a layer of highly conductive N+ III-Nitride material.

12. The device of claim 1, which further includes a highly conductive III-Nitride pad disposed between said source and drain contacts and said free surface of said first III-Nitride layer.

13. The device of claim 12, wherein said field plate is a layer of highly conductive N+ III-Nitride material.

14. The device of claim 1, which further includes a highly conductive III-Nitride pad disposed between said source and drain contacts and said free surface of said first III-Nitride layer.

15. The device of claim 1, wherein said field plate is a layer of highly conductive N+ III-Nitride material.

* * * * *